United States Patent
Iyer et al.

(10) Patent No.: US 9,025,386 B1
(45) Date of Patent: May 5, 2015

(54) EMBEDDED CHARGE TRAP MULTI-TIME-PROGRAMMABLE-READ-ONLY-MEMORY FOR HIGH PERFORMANCE LOGIC TECHNOLOGY

(71) Applicant: International Business Machines Corporation, Armonk, NY (US)

(72) Inventors: Subramanian S. Iyer, Mount Kisco, NY (US); Toshiaki Kirihata, Poughkeepsie, NY (US); Chandrasekharan Kothandaraman, Hopewell Junction, NY (US); Derek H. Leu, Hopewell Junction, NY (US); Dan Moy, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/084,646

(22) Filed: Nov. 20, 2013

(51) Int. Cl.
| | |
|---|---|
| G11C 11/34 | (2006.01) |
| G11C 16/04 | (2006.01) |
| H01L 29/66 | (2006.01) |
| H01L 29/423 | (2006.01) |
| G11C 16/10 | (2006.01) |

(52) U.S. Cl.
CPC ...... *G11C 16/0466* (2013.01); *H01L 29/66833* (2013.01); *H01L 29/4234* (2013.01); *G11C 16/10* (2013.01)

(58) Field of Classification Search
USPC .................................................. 365/185.18
See application file for complete search history.

(56) References Cited

U.S. PATENT DOCUMENTS

| | | | |
|---|---|---|---|
| 5,050,125 | A | 9/1991 | Momodomi et al. |
| 5,111,428 | A | 5/1992 | Liang et al. |
| 5,341,342 | A | 8/1994 | Brahmbhatt |
| 5,986,931 | A * | 11/1999 | Caywood ................. 365/185.06 |
| 7,817,455 | B2 | 10/2010 | Fredeman et al. |
| 2002/0191439 | A1* | 12/2002 | Caywood ................. 365/185.06 |
| 2006/0202252 | A1* | 9/2006 | Wang et al. .................. 257/314 |
| 2007/0029607 | A1* | 2/2007 | Kouznetzov .................. 257/321 |
| 2007/0141780 | A1* | 6/2007 | Higashitani .................... 438/257 |

(Continued)

OTHER PUBLICATIONS

"A Compact eFUSE Programmable Array Memory for SOI CMOS", Safran, et al., 2007 Symposium on VLSI Circuits Digest of Technical Papers; pp. 72-73.

(Continued)

*Primary Examiner* — Hoai V Ho
*Assistant Examiner* — Pablo Huerta
(74) *Attorney, Agent, or Firm* — H. Daniel Schnurmann

(57) ABSTRACT

An embedded Multi-Time-Read-Only-Memory having a (MOSFET) cells' array having an initial threshold voltage ($VT_0$) including the MOSFETs arranged in a row and column matrix, having gates in each row coupled to a wordline (WL) running in a first direction and sources in each one of the columns coupled to a bitline (BL) running in a second direction; creating two dimensional meshed source line network running in the first and second directions, in a standby state, wherein BLs and MSLN are at a voltage (VDD), and the WLs are at ground; storing a data bit by trapping charges in a dielectric of a target MOSFET, $VT_0$ of target MOSFET increasing to another voltage ($VT_1$) by a predetermined amount ($\Delta VT$); reading a data bit by using the MOSFET threshold voltage having one of $VT_0$ or $VT_1$ to determine a trapped or de-trapped charge state, and resetting the data bit to a de-trapped state by de-trapping the charge.

20 Claims, 16 Drawing Sheets

(56) References Cited

U.S. PATENT DOCUMENTS

2008/0160680 A1* 7/2008 Yuan .............................. 438/129
2011/0156044 A1* 6/2011 Lee et al. ......................... 257/60
2012/0074486 A1* 3/2012 Lue et al. ....................... 257/324

OTHER PUBLICATIONS

"A 0.13um 2.125MB 23.5ns Embedded Flash With 2GB/s Read Throughput for Automotive Microcontrollers", Demi, et al., 2007 IEEE International Solid-State Circuits Conference; pp. 478-479.

"High Performance Embedded Dynamic Random Access Memory in Nano-Scale Technologies" T. Kirihata; Springer ISBN 978-90-481-9215-1, Chapter 10, pp. 295-336.

"22nm High-Performance SOI Technology Featuring Dual-Embedded Stressors, Epi-Plate High-K Deep-Trench Embedded DRAM and Self-Aligned via 14LM BEOL", Narasimha, et al., IEEE IEDM, Dec. 2012.

"5.5GHz System z Microprocessor and Multichip Module", Warnock, et al., IEEE International Solid-State Circuits Conference; 2013.

* cited by examiner

| Mode | WL | BL | SL |
|---|---|---|---|
| Standby | GND (0V) | VDD (1V) | VDD (1V) |
| Program | EWLH (2V) | GND (0V) | EBLH (1.5V) |
| Read | VDD (1V) | *VDD - VT | VDD (1V) |
| Reset | NWLL (-1V) | VDD (1V) | VDD (1V) |

* BL is weakly forced to GND such that BL voltage is naturally generated to VDD - VT by source follower mode, where the VT is determined by the programming state of the NMOS.

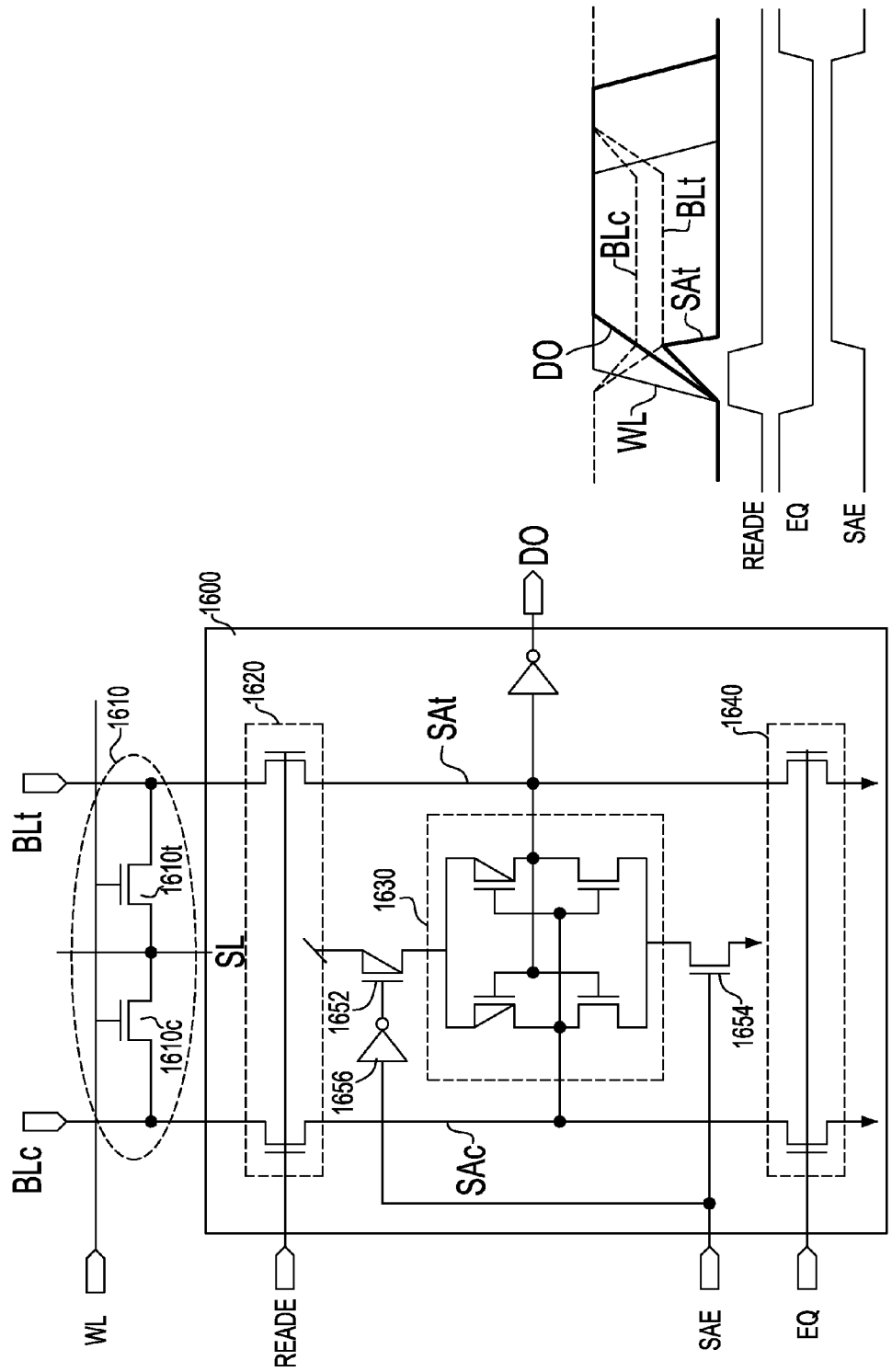

_US 9,025,386 B1_

EMBEDDED CHARGE TRAP MULTI-TIME-PROGRAMMABLE-READ-ONLY-MEMORY FOR HIGH PERFORMANCE LOGIC TECHNOLOGY

CROSS-CORRELATION TO RELATED PATENTS

This application is related to U.S. patent application Ser. No. 14/084,644 and Ser. No. 14/084,641, filed concurrently herewith, and incorporated by reference in all its details.

FIELD OF THE INVENTION

This invention is related to an embedded Multi-Time-Programmable-Read-Only-Memory (eMTPROM) for high-performance logic technology. More particularly, the invention describes the array architecture, structure, and voltage control method to design an eMTPROM using a charge trap behavior for Metal-Oxide-Semiconductor-Field-Effect-Transistor (MOSFET) fully compatible to the high performance logic technology.

BACKGROUND

The conventional approach to embedded non-volatile memory is by using an electrical fuse (hereinafter referred to as eFUSE) which is rapidly becoming unfavorable in area efficiency as the technology continues to scale down. The eFUSE, furthermore, does not allow reprogramming data bits, resulting in a one time programmable ROM. High density nonvolatile memory such as a NAND or NOR type flash memory to overcome the problems. However, inherently adding undesirable device structures such as a floating gate or ultra-thick oxide, and electrical parasitics (excessive capacitance, high voltages, typically greater than 5V), which are not supported in high a performance logic technology used, e.g., for flash memories. This requires complex additional process elements to be integrated to the high-performance logic technologies, resulting in a high cost.

SUMMARY

In an embodiment of the invention, a charge trap behavior of an N-type MOSFET (NMOS) is used. The NMOS is fully compatible to the high-performance logic technology such as for microprocessors. The memory array can use a NOR-type array structure; although it does not use a floating gate (FG). Instead the charge in the memory is trapped in the dielectric of the NMOS such that the initial NMOS threshold voltage ($VT_0$) is increased by $\Delta VT$. More specifically, the targeted NMOS as a memory cell traps the charge (i.e., electrons: e⁻) resulting in a higher threshold voltage ($VT_1 = VT_0 + \Delta VT$) for programming a "1". The untargeted NMOS FET does not trap the charge (e⁻) thus keeping the $VT_0$ for a "0" data bit. The trapped charge (e⁻) can be eliminated to recover the initial $VT_0$ by applying a reset condition. The NOR-type array is controlled by Word-Lines (WLs), Bit-Lines (BLs), and Source-Lines (SLs) for programming (or charge trapping), reading (or sensing), and resetting (or charge elimination), where SLs are meshed and common to create a meshed Source-Line Network (MSLN) in an entire NOR-type array. The MSLN structure can further be used for shielding both the WLs and the BLs.

In an embodiment, the NOR trap array pre-charges BLs and SLs at a first power supply voltage (VDD) while keeping WLs at GROUND (GND) in a standby state. Programming the data bit "1" is realized by rising BL and WL to a second power supply voltage (EBLH) and to a third power supply voltage (EWLH), respectively. The EBLH and EWLH voltages are elevated voltages from VDD. A read mode is realized by rising the selected WL to VDD, while weakly discharging the selected BLs at GND such that the weakly discharged GND BL follows the VDD SL through the NMOS in a read mode, where the NMOS operates as a source follower mode. This results in developing a voltage of ($VDD - VT_1$) for reading a "1", or a voltage of ($VDD - VT_0$) for reading "0", on the BLs. The BL voltages are sensed by sense-amplifiers.

In an embodiment, the memory cell can use a pair of NMOS to store "0" and "1" data such that a differential voltage can be developed on a pair of true and complement BLs for a sensing operation. The NOR-type array allows to eliminate the trapped charge (e-) through the entire array. In the reset mode, the BLs and MSLN are kept at the VDD voltage—the same as a standby state, while presenting the fourth power supply (NWLL) to all WLs. The NWLL is a negative voltage with respect to GND, thus applying negative voltage of (NVWLL-VDD) to the VGS for all NMOS in the entire array. The attribute results in an embedded Multi-Time-Programmable-Read-Only-Memory (eMTPROM).

In an embodiment, there is provided a method of forming an embedded Multi-Time-Read-Only-Memory (eMTPROM) including: forming a Metal-Oxide-Semiconductor-Field-Effect-Transistor (MOSFET) array of cells having an initial threshold voltage ($VT_0$) including a plurality of the MOSFETs arranged in a matrix having a first number of rows and a second number of columns, the MOSFETs having gates in each one of the rows coupled to a wordline (WL) running in a first direction and MOSFET drains in each one of the columns coupled to a bitline (BL) running in a second direction orthogonal to the first direction; creating two dimensional meshed source line network (MSLN) coupled to the MOSFET sources respectively running in the first and second directions, in a standby state, wherein the BLs and the MSLN stand at a power supply voltage (VDD), and the WLs are at GND; storing a data bit by selectively trapping charges in a dielectric of a target MOSFET, wherein the initial threshold voltage ($VT_0$) of the target MOSFET is increased to a second voltage ($V_1$) by a predetermined amount ($\Delta VT$); reading a data bit by using the MOSFET threshold voltage having one of $VT_0$ or $VT_1$ to determine a trapped or de-trapped charge state, and resetting the data bit to a de-trapped state by de-trapping the charge.

BRIEF DESCRIPTION OF THE DRAWINGS

Embodiments of the present invention will be understood and appreciated more fully from the following detailed description of the invention taken in conjunction with the accompanying drawings of which:

FIGS. 16 and 17 show the illustrated sense amplifier block shown in FIG. 5 consisting of 64 sense amplifiers, wherein the sense amplifier in each column consist of CMOS cross-coupled sense amplifier.

DETAILED DESCRIPTION

Figure 1:
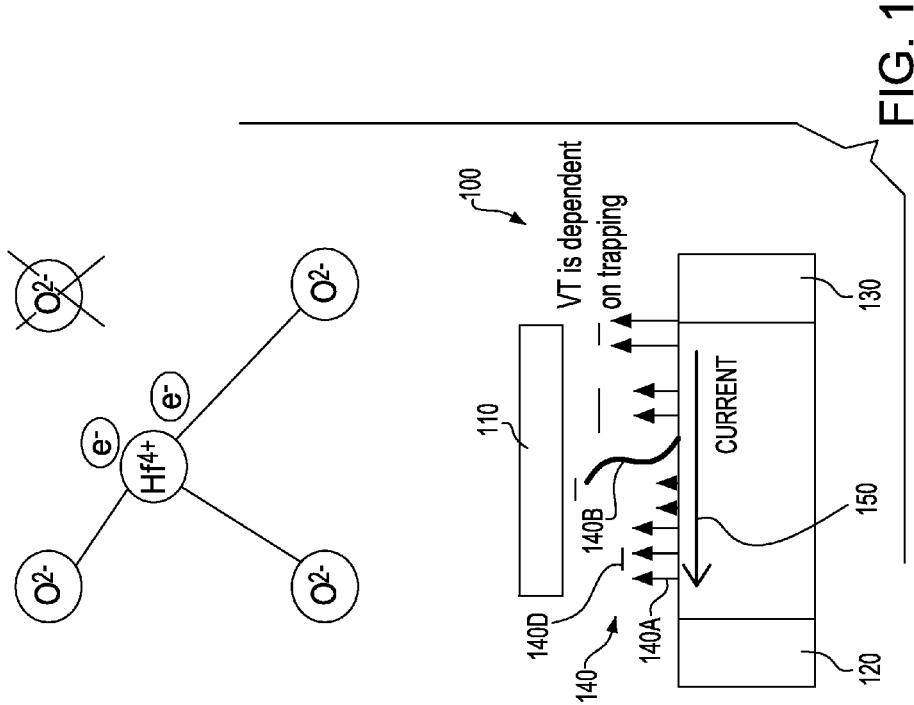
FIG. 1 shows a basic charge trap memory cell using a high performance logic NMOS lacking a floating gate.

Referring to FIG. 1, a basic charge trap memory cell will hereinafter be illustrated. The charge trap memory advantageously uses a high performance logic NMOS without a floating gate (FG). The NMOS has an initial threshold voltage of $VT_0$ for '0' data. For programming a "1", the charge trap memory cell preferably employs a behavior to trap electrons (e−) to the vacancy of oxygen ($O_2$) in the dielectric (140) of the NMOS (100). The NMOS having a High-K dielectric, such as a Hafnium ($Hf_4$) oxide demonstrates the charge trapping behavior with other High-K material dielectrics advantageously used for high performance logic technologies. The vacant oxygen point (140D) in $Hf_4$ oxide (140) traps some electrons (140A) in a condition of applying high voltage to the gate (110) while applying a high voltage between the source (120) and the drain (130) such that the NMOS strongly turns on to flow a large current though the channel (150). The trapped charge(s) (e−) increases the NMOS threshold voltage to $VT_1 = VT_0 + \Delta VT$. Furthermore, the trapped electrons (e−) (140B) can be eliminated by applying a negative voltage between the gate (110) and the source (120), resulting in recovering the $VT_0$ condition.

Figure 2:
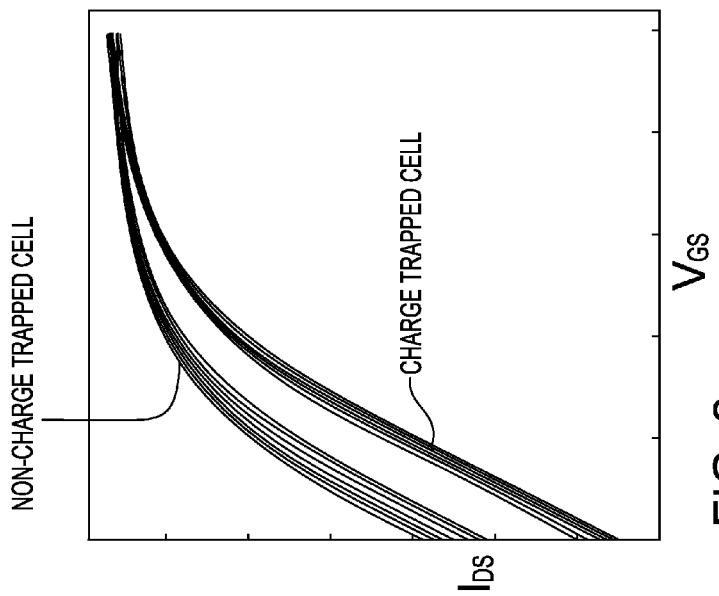
FIG. 2 illustrates a MOSFET measured source to drain current (IDS) with respect to the gate to source voltage (VGS) of an $Hf_4$ NMOS transistor.

Referring to FIG. 2, the measured source to drain current (IDS) with respect to the gate to source voltage (VGS) of the $Hf_4$ NMOS transistor (100) is shown. The IDS can be measured while applying the programming and resetting conditions several times. As expected, trapping the electrons increases the NMOS threshold, resulting in a smaller current than that without trapping. The $VT_1$ of the charge trapped NMOS can be successfully reset to $VT_0$ of a non-charge trapped NMOS.

In an embodiment, the charge trap memory can use the charge trapping behavior to store a data bit. The memory does not require floating the gate (FG) because the charge (e−) is trapped in the dielectric of the high performance logic NMOS. This results in an ideal.

Solution to develop an embedded Multi-Time-Programmable Read Only Memory (eMTPROM) customized for high performance logic technologies. The challenge presented by the eMTPROM is to maximize the charge trap efficiency with a simple control while protecting the high performance NMOS device, which uses a thin oxide and a low threshold voltage. This requires a new array architecture and voltage controls to minimize the device stress condition particularly during programming and reset operations.

Figure 3A:
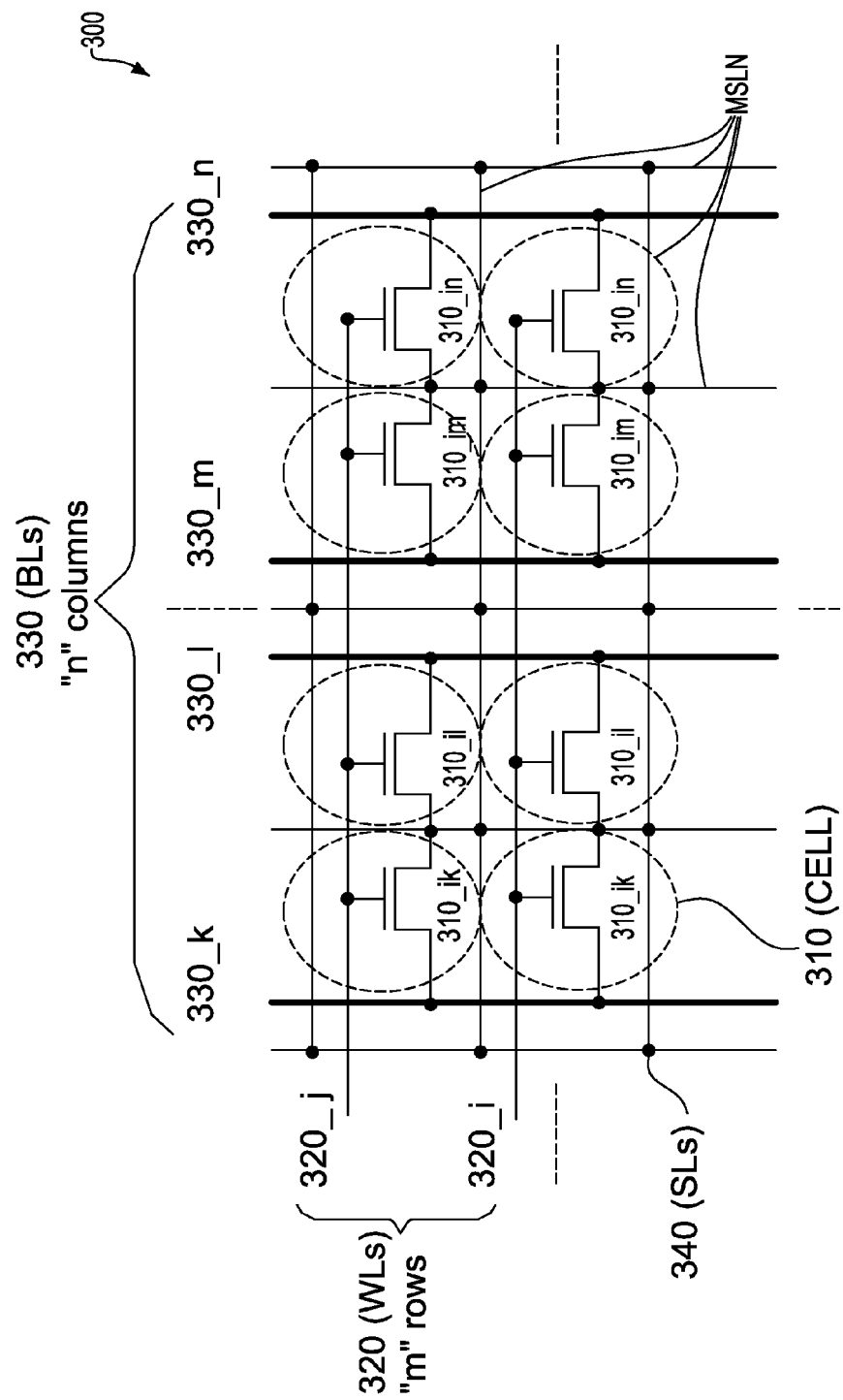
FIGS. 3A and 3B show the measured source to drain current (IDS) with respect to the gate to source voltage (VGS) of the $Hf_4$ NMOS transistor.
Figure 3B:
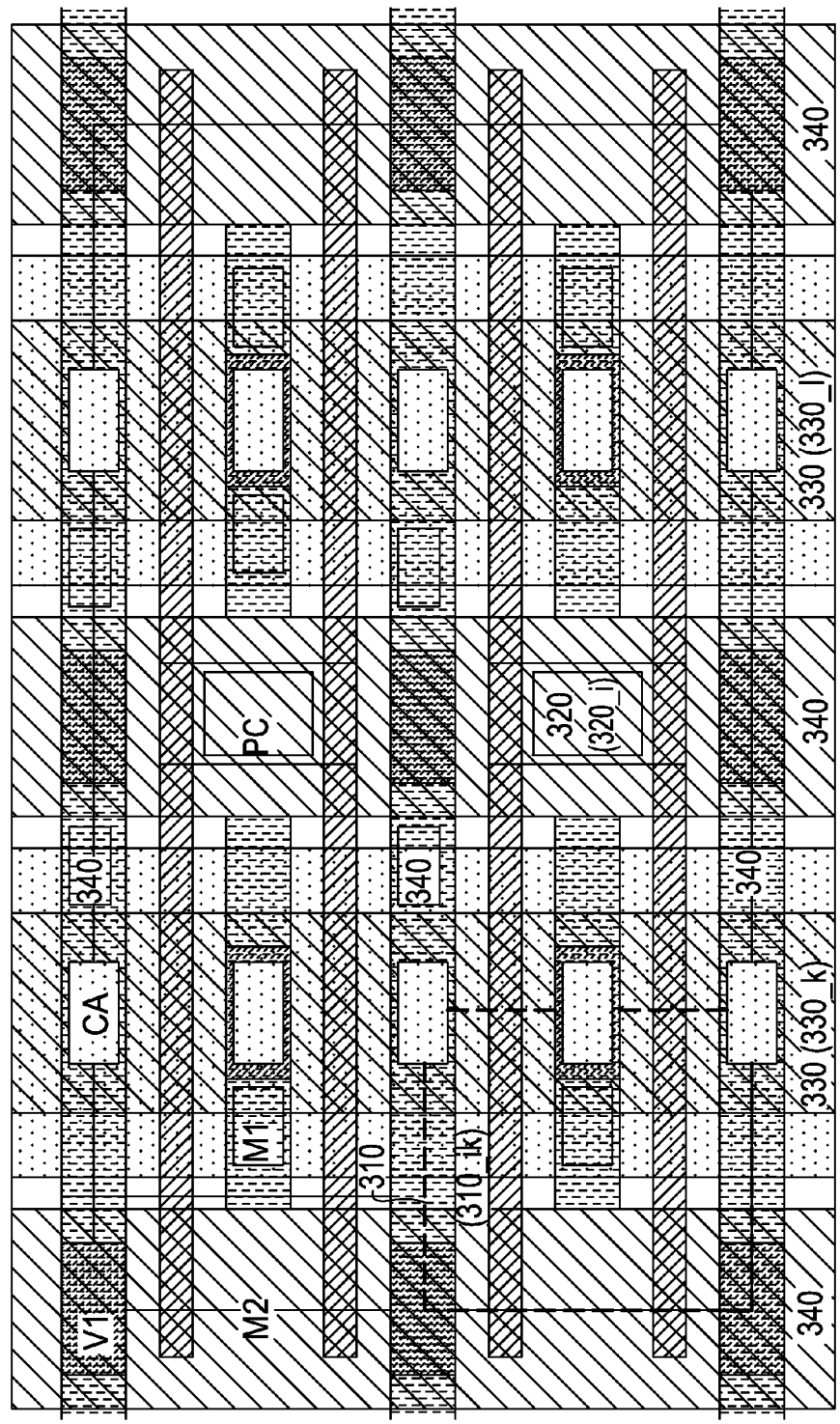

Referring to FIG. 3, a first preferred embodiment of the charge trap memory array (300) (a): schematic, b): layout) is illustrated. A single NMOS approach employs a plurality of NMOS (310), each serving as one bit memory cell. The NMOS (310) shows a thin oxide (les than 1.2 nm) and low threshold device (less than 0.2V) used for a high-performance logic technology, e.g., for microprocessors. NMOS cells (310) are arranged in a two dimensional matrix with "m" rows times "n" columns, supported by wordlines (WLs: 320) and bitlines (BLs: 330) for row and column selection, respectively. All the cells in each row are coupled to the same wordline (i.e., 320_i for row i) running in a first direction using gate polysilicon (PC) of the NMOS. The third metal M3 (not shown) runs over the contiguous PC and is periodically stitched to the array segment break (i.e., every 16 columns) to reduce the poly gate delay time constant. All the cells in each column are coupled to the same bitline (i.e., 330_k for column k) running in a second direction perpendicular to the WLs first direction using a second metal (M2). As previously described, the cell (310) does not use a floating gate (FG) to trap the charge. Instead, the charge (e−) is trapped in the dielectric of the high performance NMOS (310). Unlike a conventional NOR-type flash memory array, source lines (SL: 340) running in both, first and second directions are common and meshed in the entire array. The Meshed Source-Line Network (MSLN) can be used for shielding the BL and WL, and where the SL wiring resistance is reduced to improve the charge trap efficiency during programming. A memory cell (i.e., 310_ik) can be selectively programmed or sensed by applying target voltages (that will be described hereinafter) to the corresponding WL (i.e., 320_i) and BL (i.e., 330_k). The memory cells in the entire memory can be reset to the initial state by applying a negative voltage to all WLs. Unlike a conventional flash memory having an endurance greater than 100K, the number of programming limited to less than 1000 such that a gate oxide breakdown risk of the thin-oxide logic NMOS (310) can be acceptable. The low endurance limitation is acceptable for the eMTPROM for embedded applications such as BIOS, or for redundancy solutions.

Figure 4A:
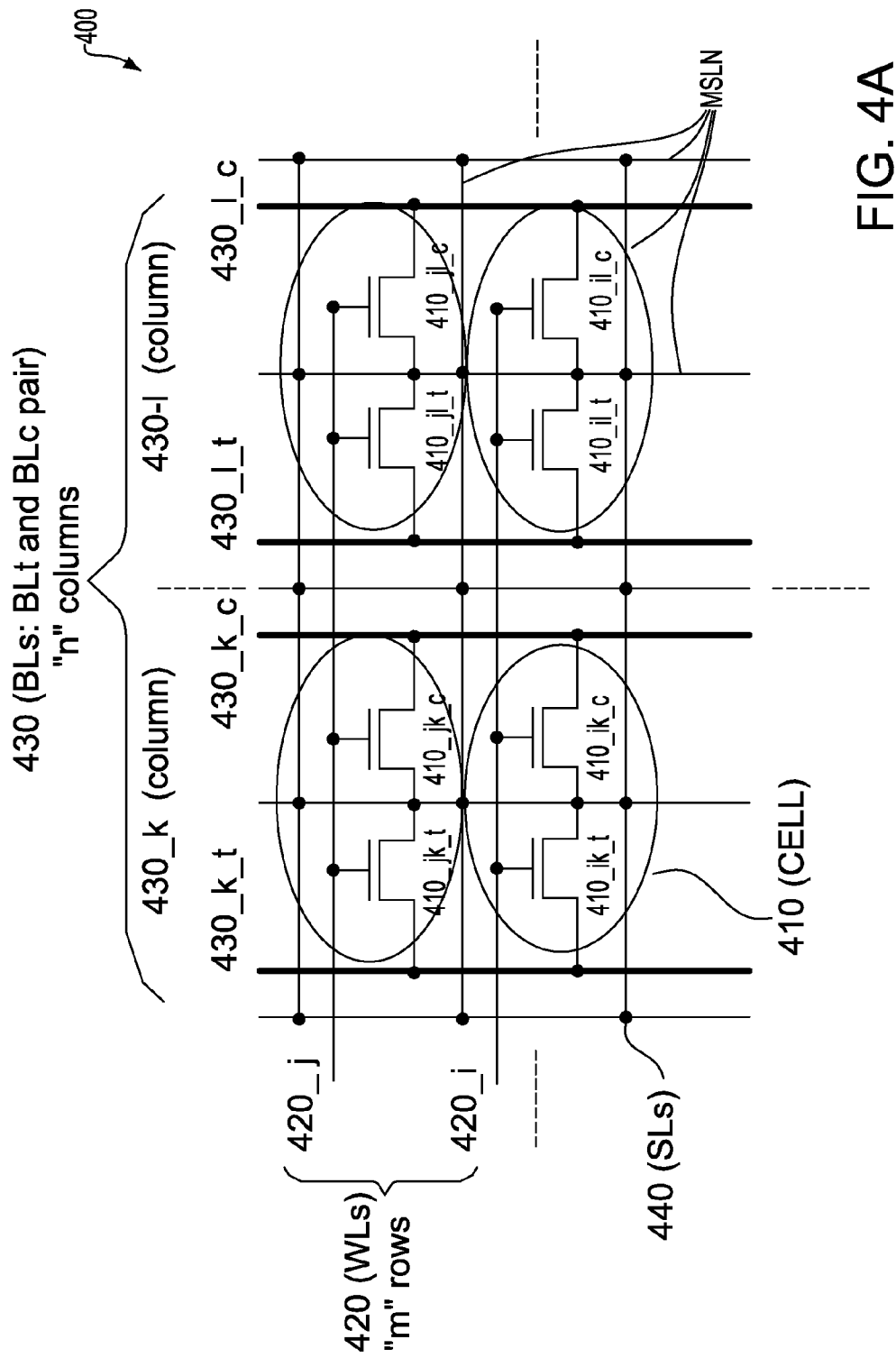
FIGS. 4A and 4B illustrate a charge trapping memory array based on a) a schematic and b) a layout), consisting of a plurality of NMOS using the same structure as previously shown.
Figure 4B:
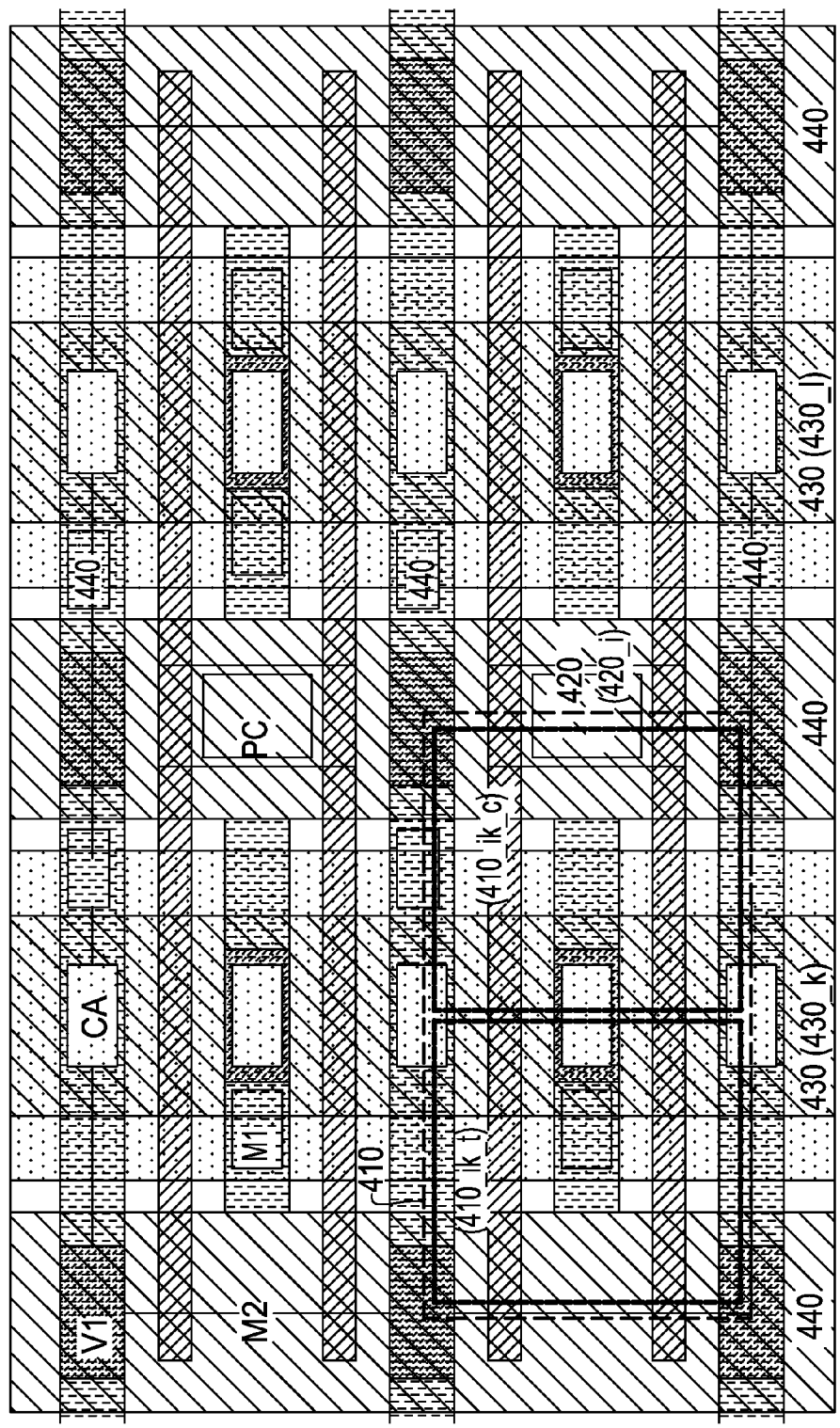

Referring to FIG. 4, there is shown a second embodiment of the charge trap memory array (400) (i: a schematic, ii: a layout). The array (400) consists of a plurality of NMOS, the structure thereof being the same as the one described in the first embodiment. A twin NMOS approach preferably employs two NMOS (i.e., 410_ik_t, and 410_ik_c) to serve one bit memory cell (410), wherein one of the two NMOS (i.e., 410_ik_t) traps the charge to increase the threshold voltage rather than the other NMOS (410_ik_c) of the pair. The approach is particularly advantageous because the signal doubles while improving the signals due to common noise elimination. A plurality of memory cells (410) each having two NMOS (i.e., 410_ik_t and 410_ik_c) are arranged in the two dimensional matrix. Similar to the first embodiment, all the cells in each row are coupled to the same wordline (i.e., 420_i) running in the first direction parallel to the gate poly (PC). The third metal M3 (not shown) runs over a contiguous PC, and is periodically stitched at the array break to reduce the poly gate delay time constant. The entire left side of the pair of NMOS within each column (i.e., 430_k) is coupled to the same true bitline (i.e., 430_k_t), and further, all the right side of the two NMOS in each column (i.e., 430_k) are coupled to the same complement bitline (i.e., 430_k_c). The BLs run in the second direction orthogonal to the WL first direction use the second metal (M2). Source lines (SL: 440) are meshed in the entire array to create the Meshed Source-Line Network (MSLN) similar the one illustrated in the first embodiment. When in a programming mode, the memory cell (i.e., either 410_ik_t, and 410_ik_c) can be selectively programmed by applying target voltages (to be described hereinafter) to the corresponding WL (i.e., 420_i), and either the true or the complementary BL (i.e., 430_k_t and 430_k_c). When in a read mode, a differential signal can be generated on the BL pair (i.e., 430_k_t and 430_k_c) amplified by a sense amplifier (not shown). The reset operation to the initial state can be realized by applying a negative voltage to all the WLs.

For illustrative purposes, a preferred chip architecture can use the twin NMOS array (two NMOS(s) per bit memory cell, as illustrated in FIG. 4. However, it can be applied for a single NMOS array approach (one NMOS per bit memory cell as shown in FIG. 3) by using a single ended sensing scheme.

Figures 5, 6:
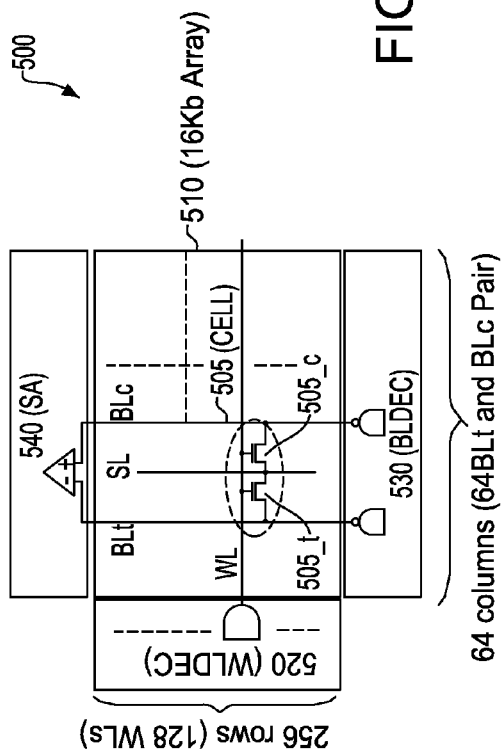
FIG. 5 illustrates a chip architecture configuring an eMT-PROM consisting of a NOR-type NMOS array, a wordline decoder block WLDEC), a bitline decoder block (BLDEC), and a sense-amplifier block.
FIG. 6 depicts target voltage conditions for WL, BL, and SL illustrated in Standby, Program, Read, and Reset modes for reducing the NMOS device stress in the programming mode and reset mode.

Referring to FIG. 5, a preferred chip architecture is shown to configure the eMTPROM (500) consisting of a NOR-type NMOS array (510), a wordline decoder block (520: WLDEC), a bitline decoder block (530: BLDEC), and a sense-amplifier block (540 SA). In one embodiment, the NOR-type NMOS array (510) preferably employs a twin NMOS approach using two NMOS per bit for a 16 Kb density as described in FIG. 4 (referenced to as a second preferred embodiment). More specifically, the 16 Kb array consists of 16K cells (505), each having two NMOS (502_t and 502) arranged in 256 rows and 64 columns of the two dimensional matrix. The 256 rows are controlled by wordline decoder block (520: WLDEC) to activate one of 256 rows (or 256 WLs) when in programming and read modes. When a WL is activated, 64 columns coupled to the WL are simultaneously selected. In a programmed (write) mode, 8 out of 64 columns are selected by the bitline decoder block (530: BLDEC). BLDEC controls the corresponding column, each having a BLt and BLc pair such that the 8 bit parallel programming out of 64 columns is enabled simultaneously. The ⅛ selection is preferable in order to avoid a large voltage drop in view of the charge trapping in the programming requiring a large current. In a read mode, 64 sense amplifier blocks (540: SA) can be used for sensing all the 64 bits selected by the activated WL since the read current is significantly less than the programming current. Optionally, SA (540) may employ, if required, an additional decoder to reduce the number of read bits.

Referring to FIG. 6, target voltage conditions for WL, BL, and SL are illustrated in Standby, Program, Read, and Rwset modes. An objective is to reduce the NMOS device stress particularly when in the programming and reset modes, details of which will be described hereinafter.

Standby Mode

Figure 7:
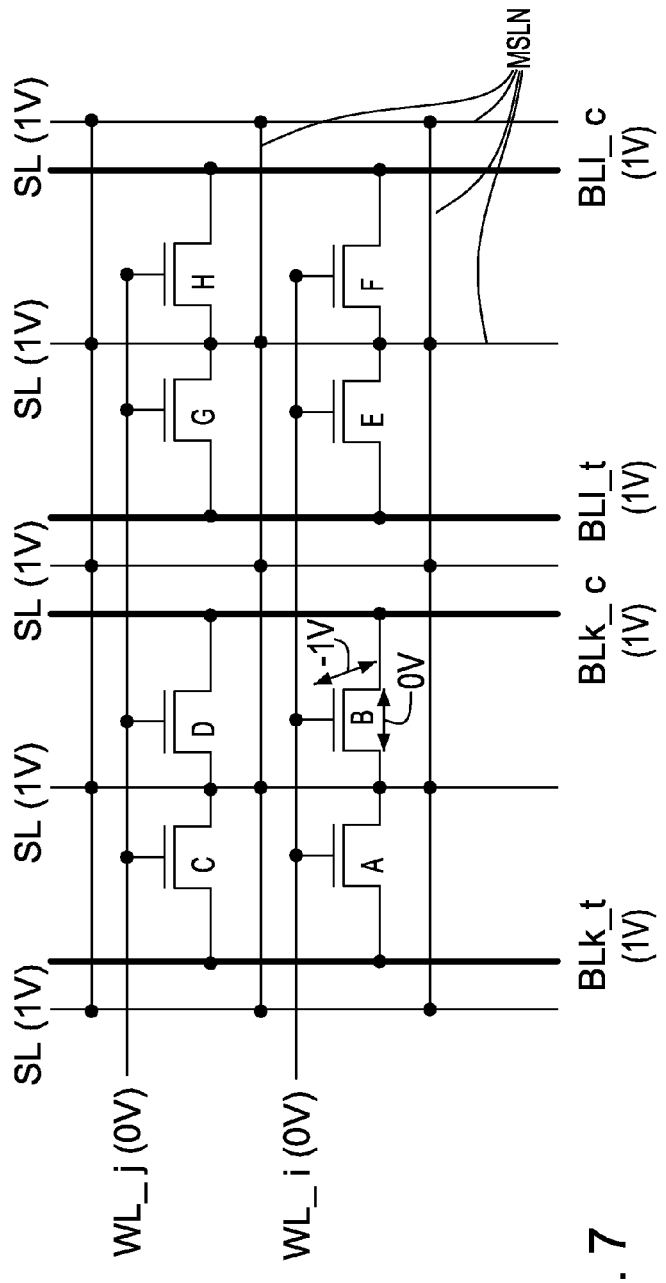
FIG. 7 depicts the Standby mode illustrating an idle state with the MTPROM waiting for a command for a Programming, Reset, or Read mode operation.

Referring to the standby mode, FIG. 7 illustrates an idle state wherein the MTPROM is waiting for a command for the Programming, Reset, or Read mode operations. Both WLDEC and BLDEC do not select any rows or columns, and all of the WLs, BLs, and SLs stand in a default state, or alternately, GND(0V), VDD(1V), and VDD(1V), respectively, turning off all the NMOS (A, B, C, D, E, F, G, H). The standby voltage selection is unique and advantageous to simplify the array control. The intent now is to minimize the MSN swing to switch to other modes (programming, read, and reset) in view of the MSN having a large capacitive load, because of meshed line structure in the entire array. In a conventional flash approach, WL, BLs, and SLs are at GND, requiring more complicated control. Regardless of the off-state leakage of the NMOS devices, the current flow stands at "0" because voltages of BLt (or BLc) and SL are both at VDD, allowing the use of a high-performance NMOS logic device, which is typically significantly leaky than devices used in a conventional flash memory. The maximum voltage applied to the NMOS is VDD (1V), results in a 100% safe state condition for reliability.

Program Mode

Figure 8:
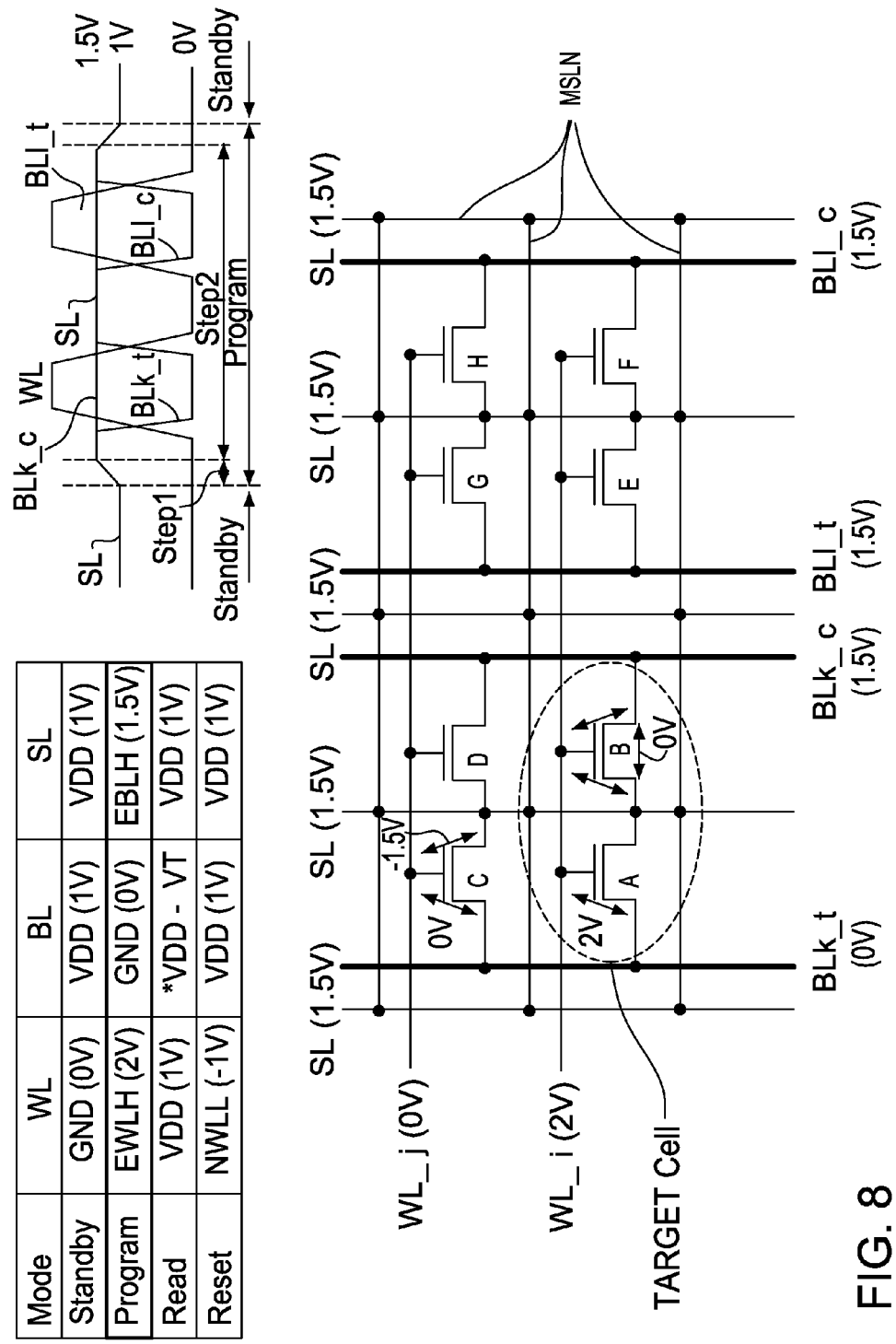
FIG. 8 shows a Program mode used for trapping the charge (electrons) to the target cell.

The program mode illustrated in FIG. 8 can be used for trapping the charge (electrons) to the target cell (TARGET). Prior to enabling the program mode, all the NMOS in all the cells start with an initial threshold voltage ($VT_0$). Following the program, the threshold voltage is increased to $VT_1=VT_0+\Delta VT$ due to the charge trapping to the dielectric of the NMOS. Moreover, one of the two NMOS (A) in the target cell traps the charge (electrons) to increase the threshold voltage to $VT_1=VT_0+\Delta VT$ due to the charge trapping the dielectric of the NMOS (A). The second NMOS (B) of the target cell remains at $VT_0$. Preferably, the charge (e−) trapping can be advantageously realized in two steps:

Firstly, when the program mode is enabled, the BL and SL voltage in the entire array are raised from VDD to an elevated bitline high voltage (EBLH) of 1.5V, while keeping all the WLs at GND (0V) in a standby state. The voltage condition (BL=SL=1.5V) preferably remains the same until the programming mode switches to another mode.

Secondly, Wordline (WL_i) coupled to the target NMOS (A) is raised to an elevated wordline high voltage (EWLH) of 2V. Concurrently, the BL (i.e., BLK_t) coupled to the target NMOS (A) is completely discharged to GND (0V) resulting in a large current flow from the SL to the BL (i.e., BLK_t) through the target NMOS (A), wherein some electrons can be trapped to vacant oxygen points in the dielectric of NMOS (A). The other BL (i.e., BLk_c) coupled to the NMOS (B) in the target cell remains at EBLH=1.5V, resulting in no current flowing through the NMOS (B). The threshold voltage of NMOS(B) therefore remains unchanged since no electrons are trapped. All other NMOS (E and F) coupled to the same activated WL (WL_i) also maintain the BL voltage at 1.5V, leaving VT (either $VT_0$ or $VT_1$) dependent when previously programmed (or not programmed) during the TARGET cell programming. The remaining cells coupled to the other WLs (i.e., WL_J) are at GND which disables all the NMOS (C,D, G,H) of the deselected row. The threshold voltage of NMOS (C, D, G, H) remains therefore unchanged during the TARGET cell programming.

The voltage selection has several advantages affecting the NMOS device reliability. Switching to the programming mode is simple because VDD coupled the BLs and MSLN raises EBLH globally of the entire array without requiring a decoder.

Considering the devices and BL's, following switching the mode to programming, the gate and source voltage (VGS) of the untargeted NMOS (B, E, and F, FIG. 8) coupled to the activated WL (WLi) with EWLH at 2V, and deselected BLs (BLk_c, BL1_t, and BL1_c) at EBLH of 1.5V, is only 0.5V (=EWLH−EBLH). As long as EWLH−EBLH is less or equal to VDD (1V), the NMOS are in a safe state, protecting the NMOS from dielectric breakdown. Moreover, the gate to drain voltage (VGD) of the untargeted NMOS (C) coupled to the strongly discharged bitline (BLK_t) for programming the target NMOS (A) is −1.5V. However, the NMOS(C) stands at an off-state—deemed to be acceptable. Although the VGS of the target NMOS (A) is still 2V, the time of the programming is significantly less, reducing the gate-breakdown device reliability risk to an acceptable level. In order to avoid an oxide breakdown, the number of programming and reset cycles can be significantly limited (i.e., less than 1000), an acceptable limitation for embedded applications. Subsequent programming for other cells can be enabled by repeating only the aforementioned second step. Once all the cells have been programmed, the mode can be switched to a standby state, changing all the BLs and MSLN to VDD.

Read Mode

Figure 9:
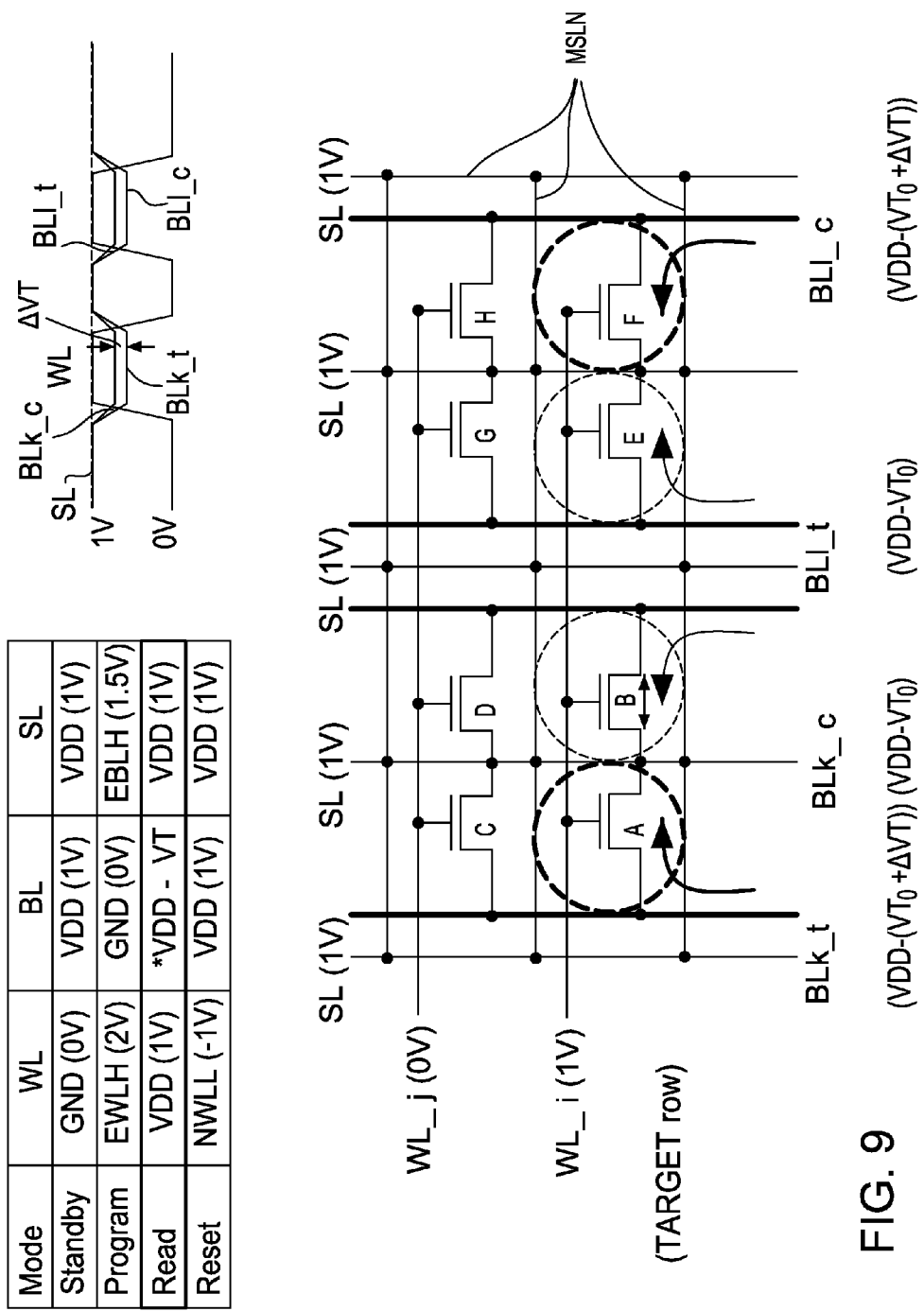
FIG. 9 illustrates the Read mode for detecting the charge trap condition for the cell, outputting the data as a binary bit per target cell.
Figure 10:
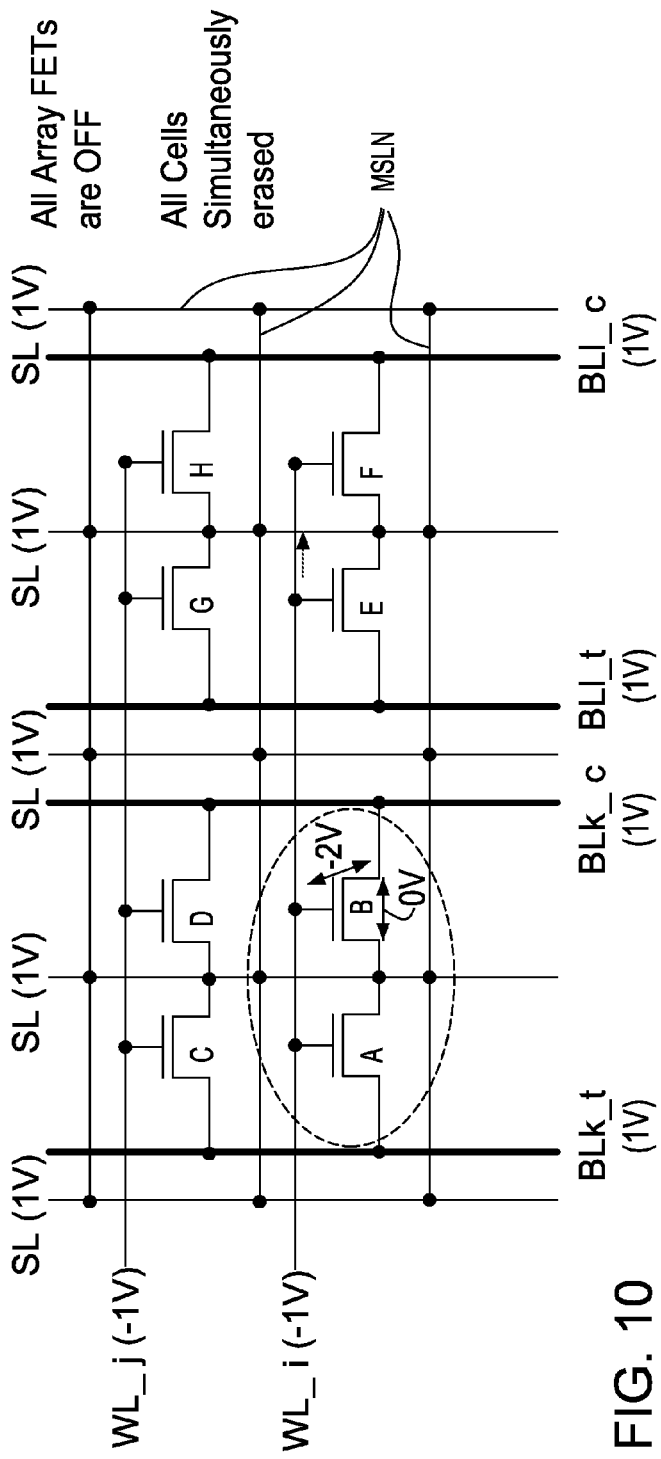
FIG. 10 illustrates a Reset mode used for de-trapping the charge (e−), wherein all the NMOS (A ... H) recover an initial VT condition ($VT_0$)

Referring now to FIG. 9, the wordline (WL_i) coupled to the target row is raised to VDD (1V). Concurrently, all the BLs are weakly discharged while keeping SL at VDD (1V). This makes it possible to emulate the source condition in view of the NMOS (A,B,E,F) coupled to the activated WLs (WL_i) naturally turned off when the BL voltage is close to VDD−NMOS threshold voltage ($VT_0$ or $VT_1$). Because one of the two NMOS in each cell traps the charge, BL (BLk_t and BL1_c) coupled to the charge trapped NMOS (A,F) becomes $VDD-VT_1$ The other BL (BLk_c and BL1_t) coupled to the un-trapped NMOS (B,E) becomes $VDD-VT_0$, resulting in creating a differential voltage of ΔVT for column (BLt and BLc pair). The differential voltage on the BL pair can be sensed by using a sense amplifier block (540: SA in FIG. 5).

The voltage selection has several advantages. Firstly, the read mode can be enabled by activating WL (WL_i rising to VDD(1V) and BLs (weakly discharging to GND), while keeping SL at VDD, which results in a simple control. Secondly, because of source follower mode emulation, the BL operation points are higher than the deselected WL voltage (WL_j (0V)), thereby eliminating a possible signal loss due to the leakage from the deselected NMOS (C,D,G,H). The elimination of leakage from the deselected NMOS (C,D,G,H) is important when used for a logic transistor, because the threshold of the NMOS is low in high-performance logic technology. The device condition in a read mode does not use any elevated voltage; thus, all the NMOS remain in a safe state.

Reset Mode

This mode can be achieved by applying all the WLs to a negative WL voltage (NWLL) of −1V globally in the entire array. Because all the BLs and SLs are kept at VDD (1V) condition, −2 V is applied to all NMOS concurrently. This results in de-trapping the charge (e−) from all the NMOS in the entire array simultaneously. Because all the NMOS are in an off-state, and the endurance (i.e., the number of the programming and reset cycles) is limited to less than 1000, a gate-oxide breakdown risk may be acceptable. The eMTPRM can further improve the reliability by integrating the next following mode.

Refresh Mode

A refresh mode is used to read a data bit, rewriting the same bit to the memory cell similar to a DRAM refresh operation. Supporting the refresh mode is beneficial particularly when the device is used at high temperature because some of the trapped charges (e−) may be eliminated as time goes by.

Default State Program Mode

An embedded application may require a default state prior to programming the data bit. In order to create a default state for a twin cell approach, one NMOS of each pair is programmed preferably during manufacturing (i.e., prior to shipping the chip to a customer). The default state program mode can be used to confirm that the device is correctly programmed. Cells unsuccessfully programmed can be replaced by way of redundancy. The WL decoder block (520 in FIG. 5) consists of 256 wordline decoders to select one out of 256 WLs using addresses 0 to 7.

Figure 11:
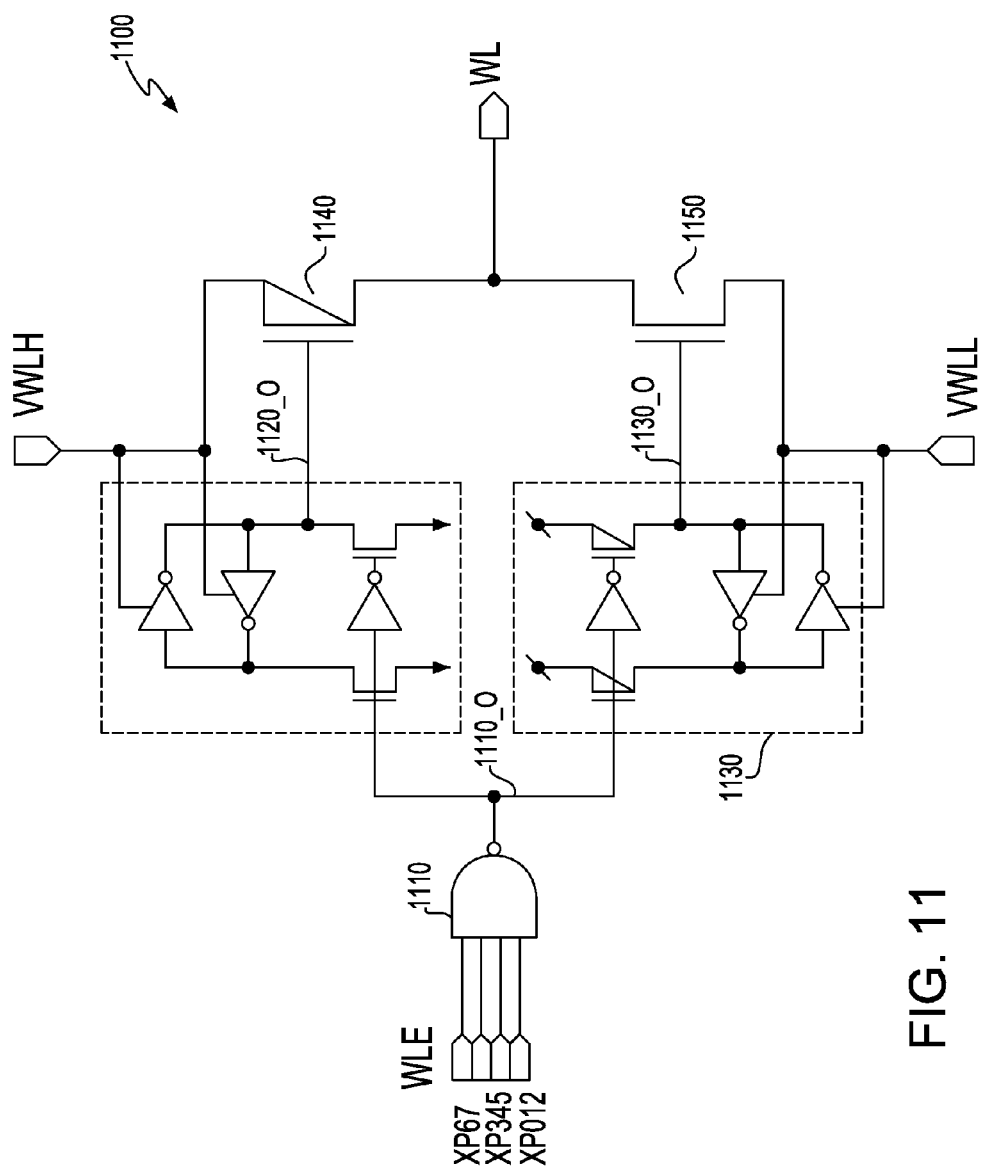
FIG. 11 depicts a wordline driver consisting of a 4-way NAND decoder, a wordline high voltage (VWLH) level shifter coupling it to a PMOS wordline driver, a wordline level shifter coupled to NMOS wordline driver.

Referring to FIG. 11, the wordline driver consists of a 4-way NAND decoder (1110), a wordline high voltage (VWLH) level shifter (1120) coupling it to a PMOS wordline driver (1140), and a wordline level shifter (1130) coupled to NMOS wordline driver (1150). Thick oxide devices (greater than 2 nm) are used for wordline level shifters (1120, 1130) and wordline drivers (1140 and 1150) to protect the device from gate oxide breakdown. The 4-way NAND decoder (1110) is coupled to signals XP012, XP345, XP67, and to a wordline enabling signal (WLE). XP012 are pre-decoded signal using address 0, 1, and 2, where one of 8 signals is high. XP345 are the pre-decoded signals using address 3, 4 and 5, wherein 1 of 8 signals is high. XP67 are the pre-decoded signals using address 6 and 7, where one of the 4 signals is high. Signal XPs are generated by the XP generator, as shown in FIG. 12.

Figure 12:
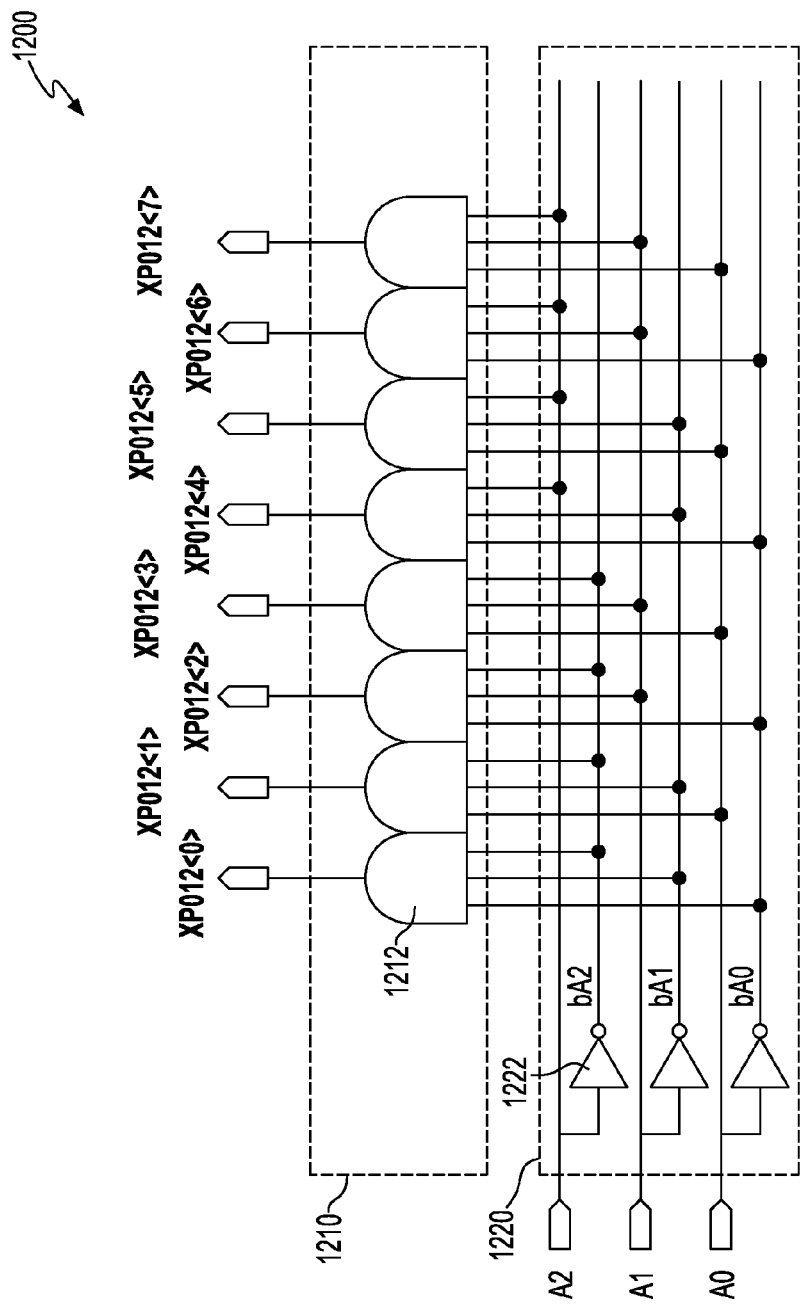
FIG. 12 shows an XP generator creating pre-decoded signals coupled to the wordline decoders including a pre-decoder having a plurality of 3-way AND logics.

Still referring to FIG. 12, XP generator (i.e., XP012) generates pre-decoded signals (i.e. XP012<0:7>) coupled to the wordline decoders (1100, FIG. 11). It consists of pre-decoder (1210) having a plurality of 3-way AND logic (1212). Each 3-way AND logic couples to the corresponding address bus (1220). The address bus (1220) includes an inverted signal for each corresponding address using an inverter (1222).

Until programming or a read command is given, the wordline enable signal (WLE) remains at low. The low level of WLE forces the node 1110_O high, regardless of XP signals. Therefore, nodes 1120_O and 1130_O are VWLH and VDD, respectively. As a result, NMOS 1150 is on, PMOS 1140 is off, making all the wordlines (WLs) at VWLL. When a read or write command is given to the eMTPROM, WLE raises to high, resulting in making the node 1110_O in the corresponding one out of the 256 WL decoders low. Low-going node 1110_O makes nodes 1120_O and 1130_O to GND and VWLL, respectively. This results in activating PMOS (114) while disabling the NMOS (1130_O), and rising the WL to VWLH. The wordline high voltage (VWLH) and wordline low voltage (VWLL) coupled to the wordline driver are controlled by a wordline voltage selector.

Figure 13:
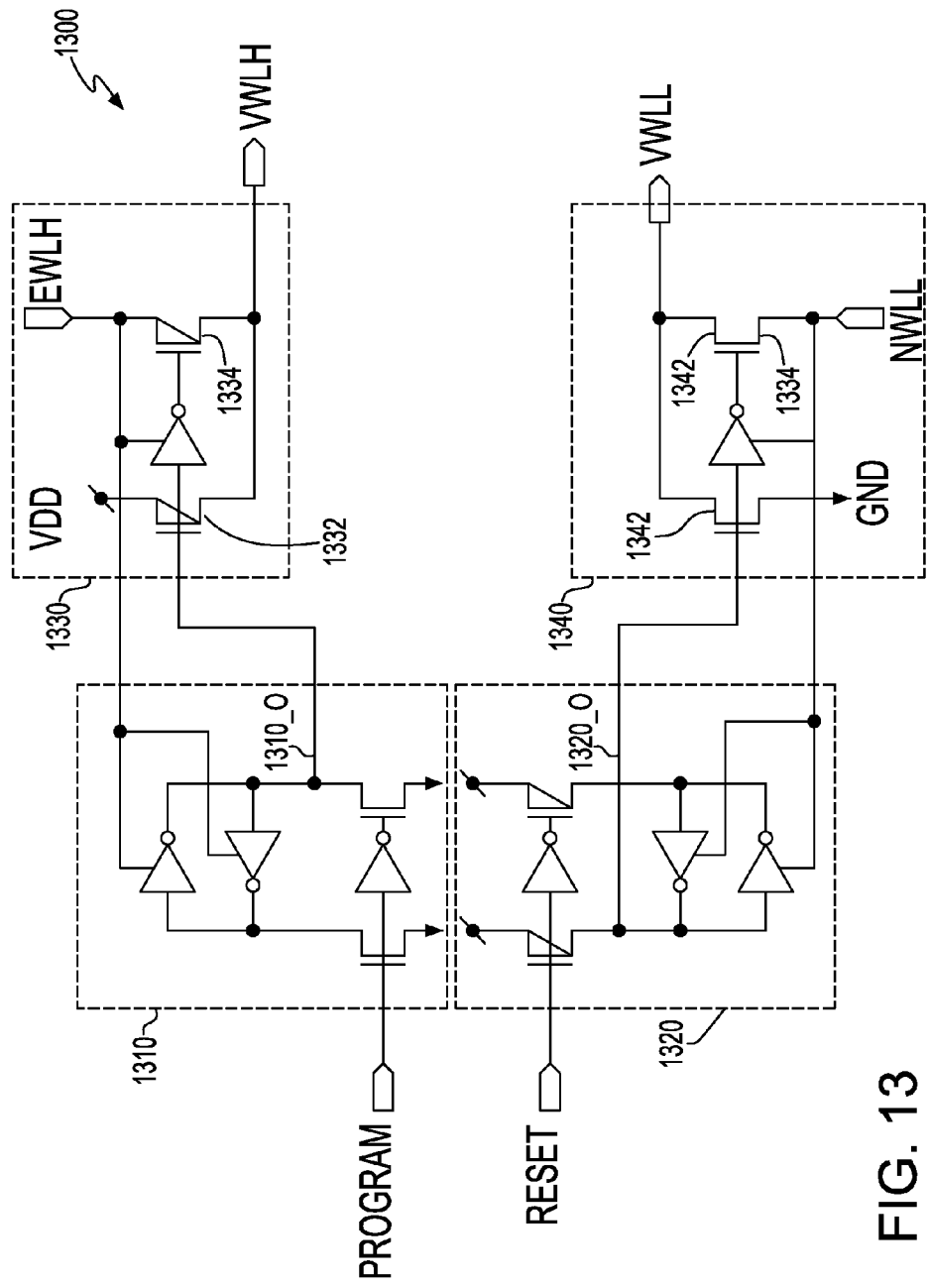
FIG. 13 shows a wordline voltage selector consisting of VWLH, a switch coupled to a level-shifter and VWLL switch coupling it to a level-shifter controlled by the mode selection signals PROGRAM and RESET.

Referring to FIG. 13, the wordline voltage selector (1300) consists of VWLH a switch (1330) coupled to a level-shifter (1310) and VWLL switch (1340) coupled to a level-shifter (1320), and further are controlled by mode selection signals, PROGRAM and RESET.

For a non-program mode, the signal PROGRAM remains low, forcing node 1310_O to low. This results in activating PMOS (1332), coupling the node VWLH to VDD. When in program mode, the signal PROGRAM raises to high, making the node 1310_O high, leading to activating the PMOS (1334), coupling the node VWLH to the elevated wordline high voltage (EWLH).

In a non-RESET mode, the signal RESET stays low, making node 1320_O high. This results in coupling node VWLL to GND. In RESET program mode, signal RESET turns to high, making the node 1320_O low, resulting in activating the NMOS (1344), coupling the node VWLL to the negative wordline low voltage (NWLL).

Figure 14:
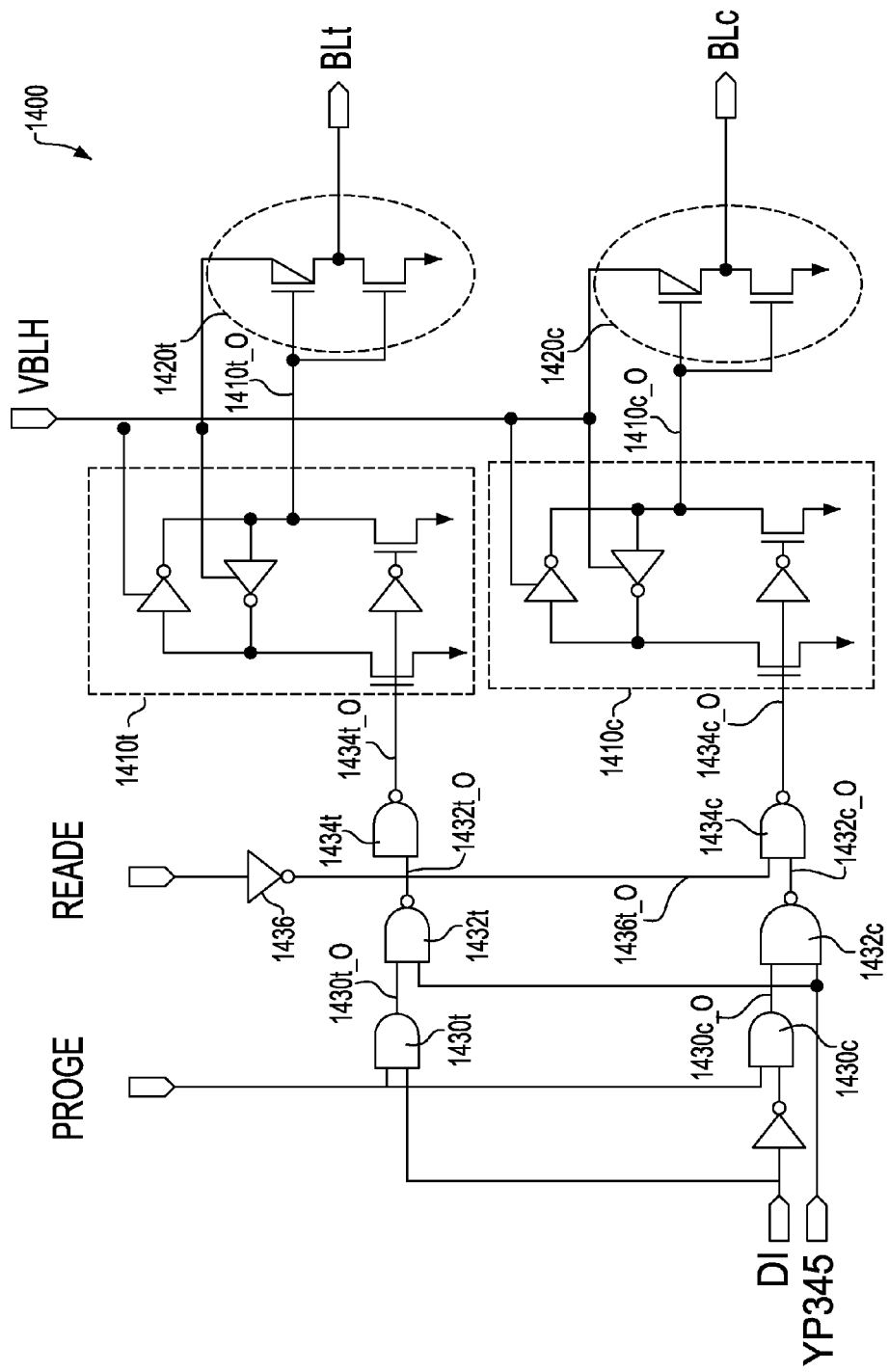
FIG. 14 illustrates a bitline decoder block consisting of 64 bitline decoders having each a BLt driver coupled to a level shifter, BLc driver coupled to a level shifter, controlled by signals (e.g. Y345), data input (DI), program enable signal (PROGE), and read enable signal (READE).

Referring to FIG. 14, the bitline decoder block (530 in FIG. 5) is shown consisting of 64 bitline decoders (1400), each having BLt driver (1420t) coupled to level shifter (1410t), and BLc driver (1420c) coupled to a level shifter (1410c) being controlled by signals Y345, data input (DI), program enable signal (PROGE), and read enable signal (READE), wherein signals Y345 are the column pre-decoded signal of a selected 8 out of 64 column, the design thereof similar to the XP decoder described with reference to FIG. 12.

Unless the PROGRAM or READ Mode is enabled, signals PROGE and READE remain low, with low PROGE coupled to the two ANDs of 1430_t and 1430c making nodes 1430t_O and 1430c_O low. As a result, node 1430t_O coupled to NAND 1342t makes node 1342t_O high, and node 1430c_O coupled to the NAND 1342c, making node 1342c_O high. Node 1436 is the inverted signal READE by inverter (1436), resulting in high. Therefore, the nodes 1434t_O and 1434c_o are both low, making node 1410_o and 1410c_o is low. Consequently, BLc and BLc are pre-charged at the VBLH voltage.

When a program mode is selected, the second step two is enabled, and corresponding column addresses are applied, signal PROGE and YP345 go high. This results in making node 1430c_O high while keeping node 1430t_O low if DI is 0, discharging BLc to GND, while pre-charging BLt at VBLH level. If DI is 1, the nodes 1430t_O and 1430c_O are high and low, respectively, discharging the BLt to GND, while keeping pre-charged BLc at the VBLH level. The BLt and BLc for unselected column (YP345 low) keep precharged at the VBLH level.

When enabling the READ mode, the signal READE goes high resulting in making nodes 1434c and 1434t high, regardless of any other condition discharging both BLt and BLc to GND. The VBLH voltage coupled to the bitline decoder is controlled by a bitline voltage selector. Optionally, the VBLH voltage can be coupled to a chip pin wherein the voltage can be preferably externally controlled.

Figure 15:
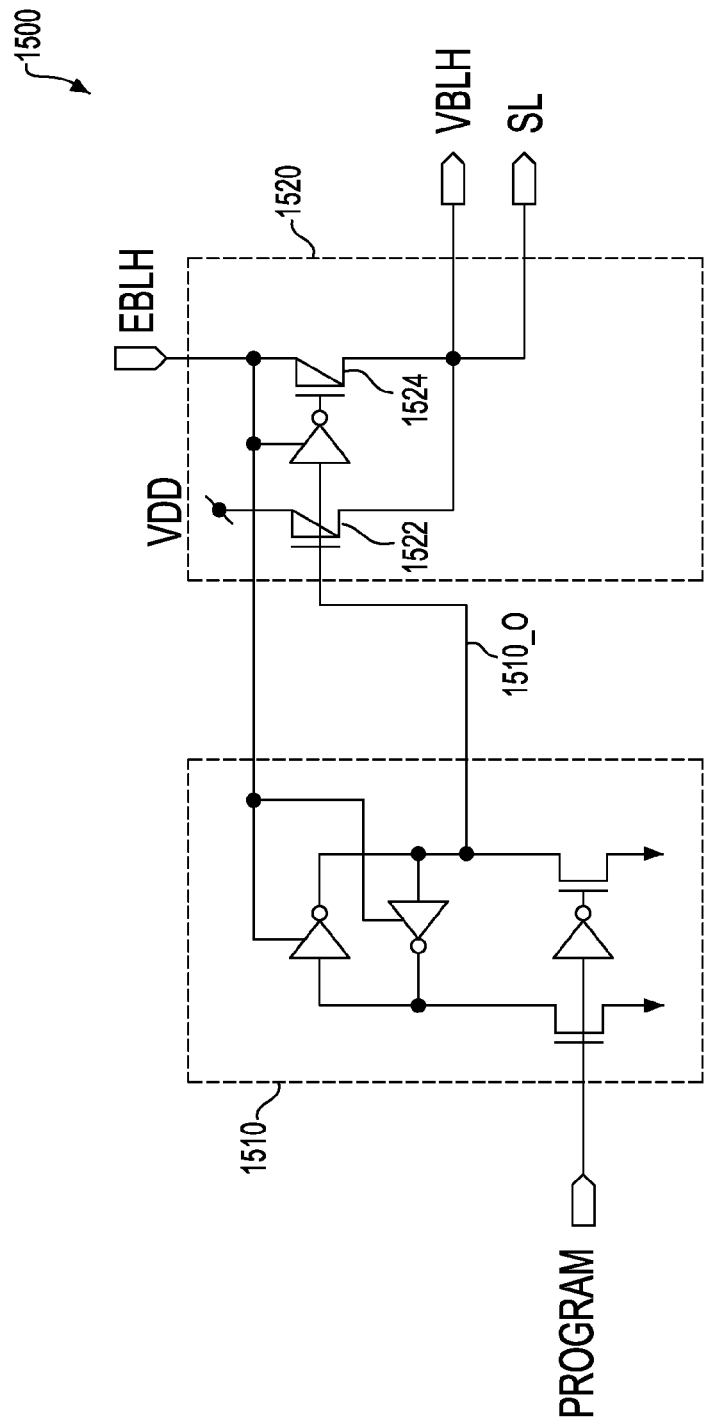
FIG. 15 depicts a bitline (BL) voltage selector consisting of a VBLH switch coupled to a level-shifter, controlled by mode selection signals (PROGRAM0.

Referring to FIG. 15, the bitline voltage selector (1500) consists of VBLH switch (1520) coupled to a level-shifter (1510) to be controlled by mode selection signal PROGRAM. As long as the signal PROGRAM is low, the node 1510_o is low, resulting in turning PMOS 1522 on and PMOS 1520 off, coupling the VBLH to VDD. When the program mode is enabled, the signal PROGRAM goes high that makes the node 1510_O high, PMOS 1524 on and PMOS 1522 off, and coupling VBLH to an elevated bitline voltage (EBLH). Since the VBLH voltage coupling to EBLH in programming mode is significantly higher than when read mode, the bitline driver 1420t and 1420c strongly discharge the selected BL to GND in programming mode, and all the BLs are weakly discharged in the read mode.

Sense amplifier block (540 in FIG. 5) consists of 64 sense amplifiers (1600). Referring to FIGS. 16 and 17, a sense amplifier in each column consists of CMOS cross-coupled sense amplifier (1630). The cross-coupled sense amplifier (1630) is controlled by bitline equalizer (1640), sense enable signal (SAE) coupled to NMOS 1654, and PMOS (1652) with inverter (1656) inverting the SAE signal. The cross-coupled nodes (SAt and Sac) are coupled to the bitline pair (BLt and BLc) by way of the read enable multiplexer (1620).

Prior to enabling the sense amplifier, the nodes SAt and Sac are precharged at GND by equalizer (1640). When a read common is given, the signal EQ goes low, disabling the equalizer (1640). Concurrently, the signal READE goes high and waits for WL activation. Assuming that the cell (1610) stores a logical data bit 1, the threshold of NMOS 1610t is $VT_1 = VT_0 + \Delta VT$, with the threshold of 1610C being $VT_0$. This develops $VDD - VT_0$ and $VDD - VT_1$ on the BLc and BLt, respectively when WL goes high. Furthermore, SAc and SAT follow BLc and BLt. Following the developing of a sufficient differential signal $\Delta VT$ (= $VT_1 - VT_0$) on the bitline pair, the signal SAE goes high, activating CMOS cross coupled sense amplifier (1630), thereby making SAt and SAc low and high respectively. The output therefore goes high, i.e., the state written in the cell (1610) assumed in the present example.

While the present disclosure has been particularly shown and described with respect to preferred embodiments thereof, it will be understood by those skilled in the art that the foregoing and other changes in forms and details may be made without departing from the spirit and scope of the present disclosure. It is intended that the present disclosure not be limited to the exact forms and details described and illustrated, but fall within the scope of the appended claims.

What is claimed is:

1. A method of forming an embedded Multi-Time-Read-Only-Memory (eMTPROM) comprising:
    forming a Metal-Oxide-Semiconductor-Field-Effect-Transistor (MOSFET) array of cells having an initial threshold voltage ($VT_0$) comprising a plurality of said MOSFETs arranged in a matrix having a first number of rows and a second number of columns, said MOSFETs having gates in each one of said rows coupled to a wordline (WL) running in a first direction and MOSFET sources in each one of said columns coupled to a bitline (BL) running in a second direction orthogonal to said first direction;
    creating two dimensional meshed source line network (MSLN) respectively running in said first and second directions in a standby state, wherein said BLs and said MSLN are at a power supply voltage (VDD), and said WLs are at a ground voltage (GND);
    storing at least one data bit by selectively trapping charges in a dielectric of a target MOSFET, wherein said initial threshold voltage ($VT_0$) of said target MOSFET is increased to a second voltage ($V_1$) by a predetermined amount ($\Delta VT$);
    reading a data bit by using said MOSFET threshold voltage having one of said $VT_0$ or $VT_1$ to determine a trapped or de-trapped charge state; and
    resetting said data bit to a de-trapped state by de-trapping said charge.

2. The method of claim 1, wherein said MOSFET is an N-type MOS (NMOS) transistor, and said charge consist of electrons.

3. The method of claim 1, wherein said MSLN shields said WLs and said BLs.

4. The method of claim 1, wherein a number of cycles of said programming and said resetting endurance is less than 1000.

5. The method of claim 2, wherein said first direction coincides with said gate polysilicon direction of said NMOS transistor.

6. The method of claim 5 further comprising selectively trapping said charge in said dielectric of a target NMOS is realized by first rising said BLs and said MSLN to a second power supply voltage (EBLH) from a standby state, followed by rising a WL coupled to said target NMOS to a third power supply voltage (EWLH) while forcing said BL coupled to said target NMOS to ground (GND), wherein a larger current flows only through said target NMOS for said selected charge trapping.

7. The method of claim 6, further comprising elevating said EBLH and said EWLH to a higher voltage than said VDD to enable changing said trap for said target NMOS, while satisfying a condition of EWLH–EBLH smaller or equal (≤) to said VDD, said deselected NMOS being protected from a gate-oxide breakdown condition.

8. The method of claim 7, wherein reading a data bit process is realized by rising said WL to said VDD, and weakly discharging said BL to emulate said source follower mode of said NMOS, wherein said BL develops an NMOS threshold dependent voltage either (VDD–$VT_0$) or (VDD–$VT_1$), enabling sensing by using said BL voltage.

9. The method of claim 8, wherein said reset operation is realized by applying a fourth voltage, said fourth voltage being a negative voltage to all of said WLs while maintaining said BLs and MSLN at said VDD voltage, wherein said trapped charge for all of said NMOS in said array are eliminated.

10. The method of claim 9 further comprising a refresh mode wherein said trapped charge is maintained by reading a data bit from said NMOS and rewriting said data bit periodically to said NMOS.

11. An Embedded Multi-Time-Read-Only-Memory (eMTPROM) comprising:
an N-type Metal-Oxide-Semiconductor-Field-Effect-Transistor (NMOS) array comprising of a plurality of cells, each having a NMOS pair arranged in n rows times m columns matrix, "n" and "m" being digits, wherein said NMOS have an initial threshold voltage ($VT_0$) structuring said array to gates of said NMOS pairs in each of said rows are coupled to a Wordline (WL) running in a first direction;
sources of one of each of said NMOS pairs in each of said columns coupled to a true bitline (BLt) run to a second direction perpendicular to said first direction, and wherein the sources of other ones of each said NMOS pairs in another column are coupled to a complement bitline (BLc) running parallel to the said BLt;
a two dimensional Meshed Source Line Network (MSLN) coupling to drains of said NMOS running both in said first and said second direction;
wordline decoders, each coupling to a corresponding one of m WLs of said array, wherein said wordline decoder have a WL driver coupling to a WL high voltage (VWLH) and a WL low voltage (VWLL);
bitline decoders, each having a true BL driver and complement BL driver coupling to a corresponding one of said n BL pairs of said array, wherein both of said bitline drivers are coupled to a bitline high voltage (VBLH);
a wordline voltage selector coupling to said VWLH to a first elevated voltage (EWLH) in programming mode, and otherwise coupling to a supply voltage (VDD),
wherein said wordline voltage selector is further coupled to a wordline low voltage (VWLL) to a negative wordline low voltage (NWLL) in a reset mode, and otherwise coupling to ground (GND); and
a bitline voltage selector coupling a bitline high voltage (VBLH) to a second elevated voltage (EBLH) in programming mode, and otherwise coupling to said VDD.

12. The eMTPROM of claim 11, wherein said MSLN shield said WLs, and BLt and BLc pairs.

13. The eMTPROM of claim 11, wherein said charge is made of electrons.

14. The eMTPROM of claim 11, wherein when in programming mode, said WL decoder selects one out of "m" of said WL's and activates corresponding of said WL's to EWLH through a wordline selector switch, and wherein said BL decoder coupled to said EBLH selects and discharges one of said BLt and BLc in each selected column out of "n" columns, while maintaining all other BLs at EBLH, and wherein said EBLHs are applied through said bitline selector switch, trapping a charge in a dielectric of one of two of said NMOS in a selected pair thereof, wherein a first one comprises a charge trap and a second one thereof is devoid of a charge trap, respectively at $VT_0$ and $VT_1$.

15. The eMTPROM of claim 14, in a read mode, wherein said wordline decoder selects one out of 'm' wordline and activates a corresponding WL to said VDD through said wordline selector switch, and wherein said bitline decoder coupling to VDD selects and discharges all of said BLs with said VDD through the bitline selector switch, developing voltages close to (VDD–$VT_0$) on one of said BLt and a voltage close to said (VDD–$VT_1$) on another of said BLc on each pair thereof.

16. The eMTPROM of claim 15, further comprising a sense amplifier to sense a differential voltage on said bitline pair, reading said charge trap state stored in said dielectric of said NMOS pair.

17. The eMTPROM of claim 16 in a reset mode, wherein said wordline decoder deselects all 'm' wordline and by said deselect ion, discharging all of said WLs to said NWLL through said wordline voltage selector, wherein said bitline decoders deselect and precharged all said BLs to said VDD through said bitline voltage selector, de-trapping said charge due to (VDD–VWLL) voltage to source to gate for all of said NMOS in said array concurrently and recovering said VT0.

18. The eMTPROM of claim 11, wherein said VBLH is controlled by a chip pin without invoking said bitline voltage selector.

19. A method of forming an embedded Multi-Time-Read-Only-Memory (eMTPROM) comprising:
forming a N-type Metal-Oxide-Semiconductor-Field-Effect-Transistor (NMOS) array of cells having an initial threshold voltage ($VT_0$) comprising a plurality of said MOSFETs arranged in a matrix having a first number of rows and a second number of columns, creating a pair of said NMOS for each cell,
said NMOS pairs having gates in each one of said rows coupled to a wordline (WL) running in a first direction and the sources of one of said NMOS of said pair in each one of said columns coupled to a true bitline (BLt) and the sources of another of said NMOS of said pair is coupled to complement (BLc), both running in a second direction orthogonal to said first direction;
creating two dimensional meshed source line network (MSLN) respectively running in said first and second directions, in a standby state, wherein said BLs and said MSLN are at a power supply voltage (VDD), and said WLs are at a ground voltage (GND);
storing a data bit by selectively trapping charges in a dielectric of one of the NMOS of a target NMOS pair, wherein said initial threshold voltage ($VT_0$) of said one of the NMOS of the pair is increased to a second voltage ($VT_1$) by a predetermined amount ($\Delta VT$);
reading a data bit by using said threshold voltages of said pair having $VT_0$ on one of said NMOS and $VT_1$ of another of said NMOS of said pair to determine a trapped or de-trapped charge state; and
resetting said data bit to a de-trapped state by de-trapping said trapped charge.

20. The eMTPROM of claim 19 comprises an in read mode, wherein said wordline decoder selects one out of "m" wordline and activates a corresponding WL to said VDD through said wordline selector switch, and wherein said bitline decoder coupling to VDD selects and discharges all of said BLs with said VDD through the bitline selector switch, developing voltages close to $(VDD-VT_0)$ on one of said BLt and a voltage close to said $(VDD-VT_1)$ on another of said BLc on each pair thereof.

* * * * *